US009531159B2

(12) United States Patent
Li et al.

(10) Patent No.: US 9,531,159 B2
(45) Date of Patent: Dec. 27, 2016

(54) DIRECTIONAL SEMICONDUCTOR WAVEGUIDE COUPLER

(71) Applicant: Skorpios Technologies, Inc., Albuquerque, NM (US)

(72) Inventors: Guoliang Li, Albuquerque, NM (US); Nikhil Kumar, Albuquerque, NM (US)

(73) Assignee: Skorpios Technologies, Inc., Albuquerque, NM (US)

( * ) Notice: Subject to any disclaimer, the term of this patent is extended or adjusted under 35 U.S.C. 154(b) by 0 days.

(21) Appl. No.: 14/642,415

(22) Filed: Mar. 9, 2015

(65) Prior Publication Data

US 2015/0253501 A1  Sep. 10, 2015

Related U.S. Application Data

(60) Provisional application No. 61/949,937, filed on Mar. 7, 2014, provisional application No. 61/950,658, filed on Mar. 10, 2014.

(51) Int. Cl.
*G02B 6/12* (2006.01)
*H01S 5/12* (2006.01)
*G02B 6/125* (2006.01)
*H01S 3/03* (2006.01)
*H01S 3/063* (2006.01)
(Continued)

(52) U.S. Cl.
CPC ............... *H01S 5/12* (2013.01); *G02B 6/125* (2013.01); *H01S 3/0315* (2013.01); *H01S 3/063* (2013.01); *H01S 3/0635* (2013.01); *H01S 3/0675* (2013.01); *H01S 3/08009* (2013.01); *H01S 3/1003* (2013.01); *H01S 3/1055* (2013.01); *H01S 5/0612* (2013.01); *H01S 5/0683* (2013.01); *H01S 5/1234* (2013.01); *H01S 5/141* (2013.01); *H01S 5/3013* (2013.01); *G02B 6/1228* (2013.01); *G02B 2006/12097* (2013.01);
(Continued)

(58) Field of Classification Search
CPC .................. H01L 2924/00014; H01L 2924/00; G02B 6/12; G02B 6/4214; G02B 6/26
USPC ................................... 385/14, 15, 31, 39, 43
See application file for complete search history.

(56) References Cited

U.S. PATENT DOCUMENTS

| 5,454,058 | A | 9/1995 | Mace et al. |
| 2003/0035446 | A1 | 2/2003 | Griffel |
| 2004/0013339 | A1 | 1/2004 | Arakawa |
| 2004/0066999 | A1 | 4/2004 | Sakamoto et al. |
| 2004/0114872 | A1 | 6/2004 | Nagai |
| 2012/0224813 | A1 | 9/2012 | Chen et al. |

(Continued)

FOREIGN PATENT DOCUMENTS

JP  EP 1507166 A1 * 2/2005 ............. G02B 6/125

OTHER PUBLICATIONS

"Evanescent Waveguide Couplers" *Lumberical Knowledge Base.* Web. Mar. 6, 2015. < http://docs.lumerical.com/en/index.html?pic_passive_waveguide_couplers_evanescent.html>.
(Continued)

*Primary Examiner* — Jennifer Doan
(74) *Attorney, Agent, or Firm* — Kilpatrick Townsend & Stockton LLP

(57) ABSTRACT

An optical, directional coupler has a first input, a second input, a first output, and a second output. The coupler is made with a shoulder disposed on a substrate and a first ridge and a second ridge disposed on the shoulder. The first ridge extends from the first input to the first output. The second ridge extends from the second input to the second output. The shoulder, the first ridge, and the second ridge taper to provide coupling and are modified to select a coupling ratio.

14 Claims, 10 Drawing Sheets

(51) Int. Cl.
*H01S 3/067* (2006.01)
*H01S 3/08* (2006.01)
*H01S 3/10* (2006.01)
*H01S 3/1055* (2006.01)
*H01S 5/06* (2006.01)
*H01S 5/30* (2006.01)
*H01S 5/0683* (2006.01)
*H01S 5/14* (2006.01)
*G02B 6/122* (2006.01)
*H01S 5/02* (2006.01)
*H01S 5/10* (2006.01)

(52) U.S. Cl.
CPC .... *G02B 2006/12147* (2013.01); *H01S 5/021* (2013.01); *H01S 5/1032* (2013.01); *H01S 5/1218* (2013.01)

(56) References Cited

U.S. PATENT DOCUMENTS

2013/0022312 A1   1/2013   Taillaert et al.
2015/0109661 A1   4/2015   Li et al.

OTHER PUBLICATIONS

ISR/WO mailed on May 29, 2015 for International Patent Application No. PCT/US2015/019482 filed on Mar. 9, 2015, all pages.
Notice of Allowance mailed on Sep. 17, 2015 for U.S. Appl. No. 14/642,443, filed Mar. 9, 2015; all pages.

* cited by examiner

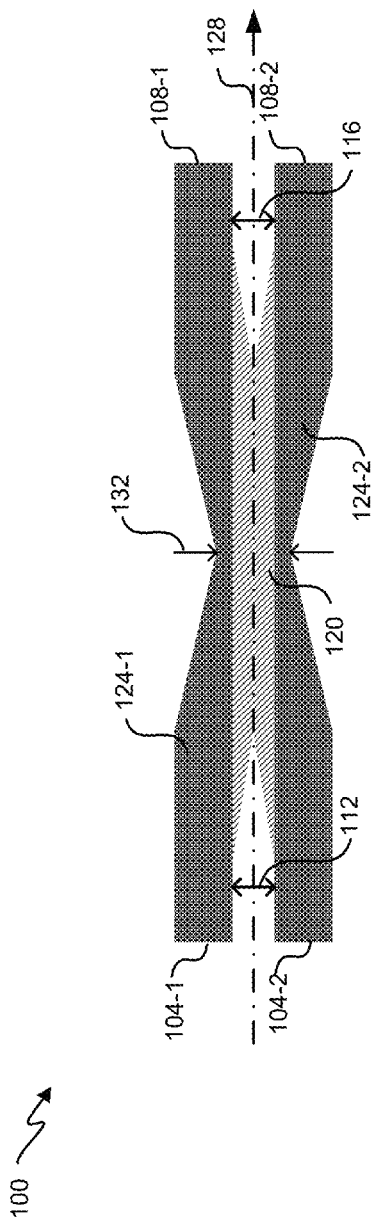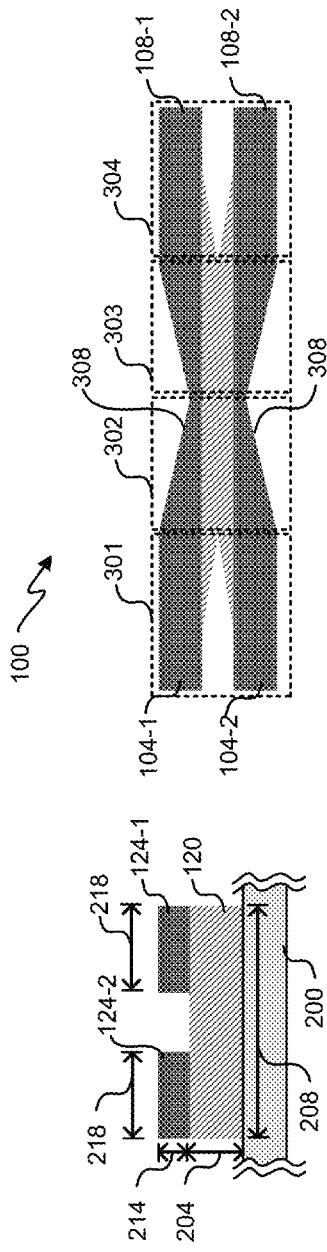

DIRECTIONAL SEMICONDUCTOR WAVEGUIDE COUPLER

CROSS-REFERENCE TO RELATED APPLICATIONS

This application claims priority to U.S. Provisional Patent Application No. 61/949,937, filed on Mar. 7, 2014, entitled "DIRECTIONAL SEMICONDUCTOR WAVEGUIDE COUPLER," the disclosure of which is incorporated by reference in its entirety for all purposes. This application further claims priority to U.S. Provisional Patent Application No. 61/950,658, filed on Mar. 10, 2014, entitled "TUNABLE LASER WITH DIRECTIONAL COUPLER," the disclosure of which is incorporated by reference in its entirety for all purposes.

The following two U.S. patent applications (including this one) are being filed concurrently, and the entire disclosure of the other application is incorporated by reference into this application for all purposes:
Application Ser. No. 14/542,415, filed Mar. 9, 2015, entitled "DIRECTIONAL SEMICONDUCTOR WAVEGUIDE COUPLER"; and
Application Ser. No. 14/642,443, filed Mar. 9, 2015, entitled "TUNABLE LASER WITH DIRECTIONAL COUPLER".

BACKGROUND OF THE INVENTION

Optical waveguiding elements convey light from one point to another through an optically transparent, elongated structure by modal transmission, total internal reflection, and/or total reflectorization. An optical waveguide directs radiation in the visible, infrared, and/or ultra-violet portions of the radiation spectrum by total internal reflection.

This application further relates to tunable lasers. More specifically, and without limitation, to tunable semiconductor lasers using binary super gratings.

BRIEF SUMMARY OF THE INVENTION

In some embodiments, a laser has a first binary super grating (BSG), a second BSG, a gain medium, and a directional coupler. The first BSG and the second BSG form an optical resonator. The gain medium and the directional coupler are, at least partially, in an optical path of the optical resonator.

A directional coupler shifts a portion of electromagnetic radiation (e.g., light in the UV, visible, and/or IR spectrums) from a first waveguide to a second waveguide. Light travels in a waveguide from one or more inputs to one or more outputs. Often, the first waveguide and the second waveguide are parallel for a given length, and a certain percentage of light from the first waveguide transitions to the second waveguide through sides of the waveguides instead of through the ends of the waveguides.

In some embodiments, a directional coupler for optically coupling waveguides comprises a first input; a second input; a first output; a second output; a shoulder disposed on substrate; a first ridge disposed on the shoulder; and a second ridge disposed on the shoulder. The shoulder extends from the first input to the first output, from the second input to the second output, from the first input to the second output, and from the second input to the first output. The first ridge extends from the first input to the first output, wherein the first ridge comprises the material. The second ridge extends from the second input to the second output, wherein: the second ridge comprises the material; and the second ridge is separate from the first ridge. In some embodiments, the directional coupler further comprises a first region where the shoulder tapers; a second region where the first ridge and the second ridge taper; a third region where the first ridge and the second ridge taper in an opposite direction than in the second region; and a fourth region where the shoulder tapers in an opposite direction than in the first region. In some embodiments, the shoulder tapers in the first region to increase a width of the shoulder, wherein the shoulder extends beyond an outside edge of the first ridge and beyond an outside edge of the second ridge.

In some embodiments, a method for coupling thick-silicon waveguides using a directional coupler is disclosed. Light is guided into a first input of the directional coupler, wherein: the directional coupler has a first ridge extending from the first input to a first output; and the directional coupler has a second ridge extending from a second input to a second output. Light is guided from the first input, to the first ridge, and then the first ridge, through a shoulder, to the second ridge. Light is guided from the second ridge to the second output.

In some embodiments, a tunable laser comprises: a first wavelength selective element characterized by a first reflectance spectrum; a second wavelength selective element characterized by a second reflectance spectrum, wherein the first wavelength selective element and the second wavelength selective element form an optical resonator; a gain medium between the first wavelength selective element and the second wavelength selective element; and a directional coupler between the first wavelength selective element and the second wavelength selective element, wherein the directional coupler provides an output coupler for the laser.

In some embodiments, a method of operating a tunable laser is disclosed. A first a first wavelength selective element is tuned. A second wavelength selective element is tuned, wherein the first wavelength selective element and the second wavelength selective element form an optical resonator. Optical emission is from a gain medium disposed between the first wavelength selective element and the second wavelength selective element. The optical emission is guided to pass through a directional coupler. A first portion of the optical emission is transmitted out of the optical resonator using the directional coupler. And a second portion of the optical emission is transmitted to the first wavelength selective element using the directional coupler. In some embodiments, the first wavelength selective element comprises a binary super grating (BSG) having a first number of super periods; the second wavelength selective element comprises a BSG having a second number of super periods; and the first number of super periods equals the second number of super periods. In some embodiments, the first number of super periods is not more than one, two, and/or three greater than the second number of super periods.

Further areas of applicability of the present disclosure will become apparent from the detailed description provided hereinafter. It should be understood that the detailed description and specific examples, while indicating various embodiments, are intended for purposes of illustration only and are not intended to necessarily limit the scope of the disclosure.

BRIEF DESCRIPTION OF THE DRAWINGS

FIG. 1 depicts a top view of an embodiment of a directional coupler.

FIG. 2 depicts a cross-sectional view of an embodiment of the directional coupler.

FIG. 3 depicts a top view of an embodiment of the directional coupler showing regions of the directional coupler.

Figure 4:
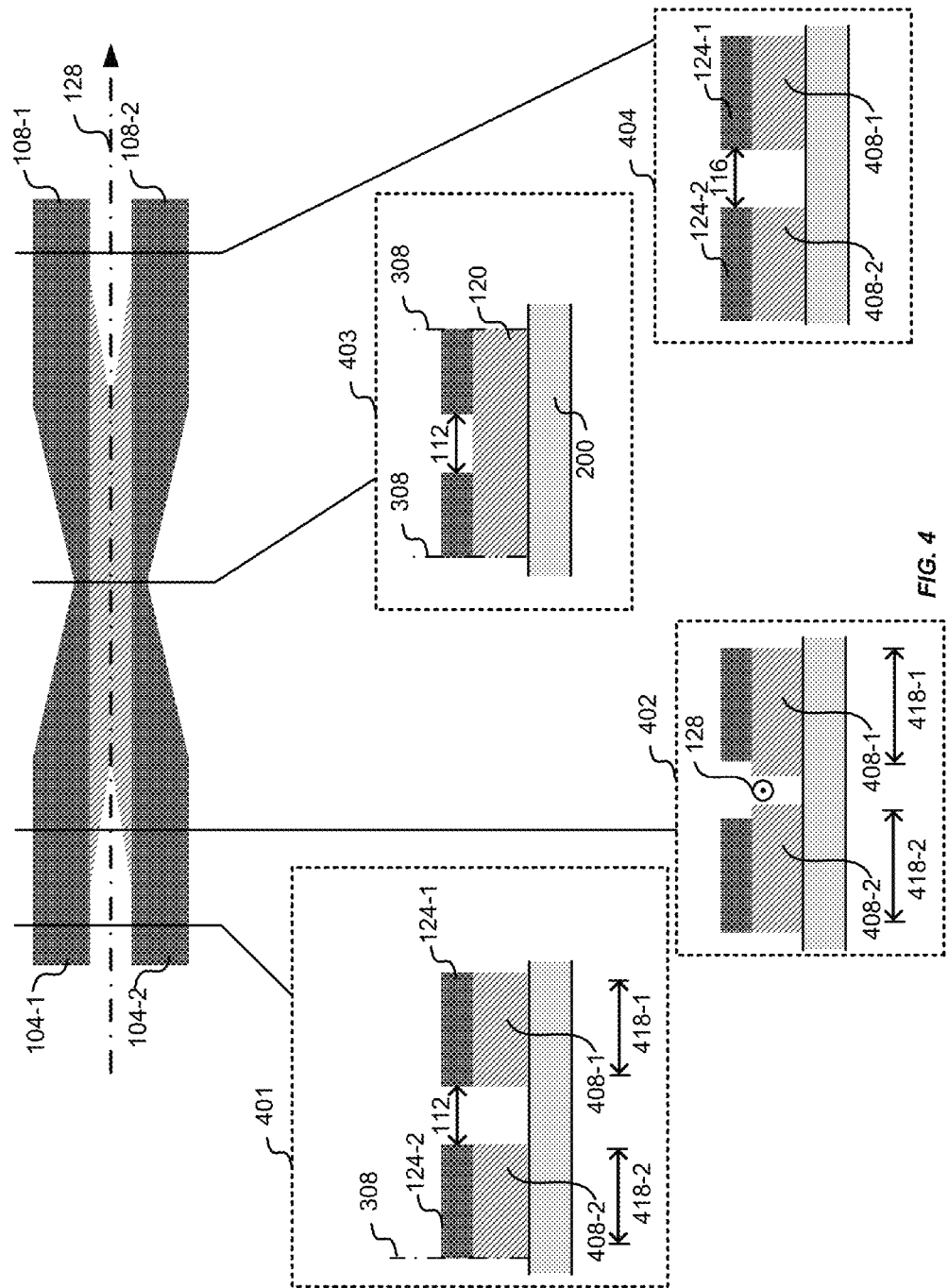
FIG. 4 depicts a top view and cross-sectional views of an embodiment of the directional coupler.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

The ensuing description provides exemplary embodiment(s) only, and is not intended to limit the scope, applicability, or configuration of the disclosure. Rather, the ensuing description of the exemplary embodiment(s) provides those skilled in the art with an enabling description. It is to be understood that various changes may be made in the function and arrangement of elements without departing from the spirit and scope as set forth in the appended claims.

Some embodiments relate generally to directionally coupling two optical waveguides. More specifically, and without limitation, to directionally coupling high-contrast, thick-silicon waveguides using tapers. In thick-silicon, modes are more tightly confined (wherein thick silicon is greater than 0.3, 0.5, or 0.7 μm thick and/or has an effective refractive index greater than or equal to 2.9, 3.0, or 3.2). Thus simply bringing two waveguides closer together for coupling in thick silicon is not as efficient as in thin silicon because in thin silicon modes are not as tightly confined. Further, separating two thick-silicon waveguides by a narrow distance can require more stringent processing tolerances than if waveguides are further apart. Also, some embodiments describe using a directional coupler in a tunable laser system.

FIG. 1 is a top view of an embodiment of a directional coupler 100. The directional coupler 100 has first input 104-1, a second input 104-2, a first output 108-1, and a second output 108-2. The first input 104-1 and the second input 104-2 are separated by a first gap 112. The first output 108-1 and the second output 108-2 are separated by a second gap 116.

The directional coupler 100 is disposed on a substrate. The directional coupler 100 comprises a lower portion, sometimes referred to as a coupler shoulder 120. The directional coupler 100 comprises two upper portions, sometimes referred to as a first ridge 124-1 and a second ridge 124-2. The coupler shoulder 120 is disposed on the substrate. The ridges 124 are disposed on portions of the coupler shoulder 120 so that the coupler shoulder 120 is between the ridges 124 and the substrate. The first ridge 124-1 extends from the first input 104-1 to the first output 108-1. The second ridge 124-2 extends from the second input 104-2 to the second output 108-2.

The directional coupler 100 is symmetrical about a longitudinal axis 128. The longitudinal axis 128 is substantially in a direction of beam propagation from the inputs 104 to the outputs 108. The directional coupler 100 has a coupler waist 132. The coupler waist 132 is equidistant between the inputs 104 and the outputs 108. The coupler waist 132 has a cross section perpendicular (laterally) to the longitudinal axis 128. The coupler waist 132 is the most narrow part of the directional coupler 100.

FIG. 2 is a cross-sectional view of an embodiment of the directional coupler 100 at the coupler waist 132. The coupler shoulder 120 is disposed on a substrate 200. The substrate 200 extends laterally wider than the directional coupler 100 and longer (longitudinally) than the directional coupler 100. The first ridge 124-1 and the second ridge 124-2 are disposed on the coupler shoulder 120 and separated by a width equal to the first gap 112. Though the coupler shoulder 120 and the ridges 124 are shown with different shading, the coupler shoulder 120 and the ridges 124 are formed from the same type of material (e.g., crystalline silicon; by etching and/or deposition). The coupler shoulder 120 and the ridges 124 form a core of the directional coupler 100. In some embodiments, the coupler shoulder 120 and the ridges 124 are covered with an upper cladding (e.g., SiO2, epoxy, and/or photoresist) having an index of refraction that is less than the core of the directional coupler 100 so that light (e.g., optical modes of a beam of light) is confined within the core of the directional coupler 100. In some embodiments, the coupler shoulder 120 and the ridges 124 are not covered with an upper cladding but left exposed to air as a cladding. The substrate 200 comprises as material that has a refractive index less than the core of the directional coupler 100, which acts as a lower cladding. In some embodiments, the substrate 200 comprises a buried oxide (BOX) layer of a silicon-on-insulator (SOI) wafer; the core of the directional coupler 100 is formed from a device layer of the SOI wafer; and a handle portion of the SOI wafer is below the BOX layer.

The coupler shoulder 120 has a shoulder height 204 (height measured in a direction away from the substrate 200). In some embodiments, the shoulder height 204 ranges from 0 to 2.5 μm (e.g., 0.0, 0.1, 0.5, 0.75, 0.85, 0.95, 1.0, 1.2, 1.5, 2.0, or 2.5 μm). The coupler shoulder 120 has a shoulder width 208 (width measured in a lateral direction compared to the longitudinal axis 128 and orthogonal to height). The shoulder width 208 varies along the longitudinal axis 128.

The ridges 124 have a ridge height 214. In some embodiments, the ridge height 214 ranges from 0.1 to 2.0 μm (e.g., 0.1, 0.2, 0.3, 0.45, 0.55, 0.65, 0.75, 1.0, 1.5, or 2.0 μm). The ridges 124 each have a ridge width 218. The ridge width 218 varies along the longitudinal axis 128. At the coupler waist 132, the first ridge 124-1 is separated from the second ridge 124-2 by the first gap 112. In some embodiments, the first ridge 124-1 is separated from the second ridge 124-2 by the first gap 112 along the longitudinal axis 128.

Referring next to FIG. 3, the coupler 100 is shown having four regions: a first region 301, a second region 302, a third region 303, and a fourth region 304. The first region 301 comprises the inputs 104. In the first region 301 at the inputs 104, the coupler shoulder 120 is separated into two portions: a first portion of the coupler shoulder 120 under the first ridge 124-1 and a second portion of the coupler shoulder 120 under the second ridge 124-2. At the inputs 104, the first portion of the coupler shoulder 120 is separated from the second portion of the coupler shoulder 120 by the first gap 112. In the first region 301, the coupler shoulder 120 tapers inward in a longitudinal direction, toward the longitudinal axis 128, until the first portion of the coupler shoulder 120 merges with the second portion of the coupler shoulder 120. In the first region 301, the ridge width 218 remains constant in the longitudinal direction.

The second region 302 is adjacent, longitudinally, to the first region 301. In the second region 302, outside edges 308 of the coupler shoulder 120 and the ridges 124 taper (narrow). In the second region 302, the first portion of the coupler shoulder 120 is merged with the second portion of the coupler shoulder 120 (e.g., indistinguishable and/or contiguous so that there is no gap between the first portion of the coupler shoulder 120 and the second portion of the coupler shoulder 120). Thus, in some embodiments, light is not evanescently coupled, but directly coupled in the directional coupler 100. In some embodiments, light is directly coupled instead of evanescently coupled to have greater coupling efficiency, more flexible manufacturing tolerances, and/or reduce attenuation. The ridges 124 remain separated by the first gap 112.

The third region 303 is adjacent, longitudinally, to the second region 302. The third region 303 mirrors the second region 302. In the third region 303, outside edges 308 of the coupler shoulder 120 and the ridges 124 taper (widen). The first portion of the coupler shoulder 120 remains merged with the second portion of the coupler shoulder 120. The ridges 124 remain separated by the first gap 112.

The fourth region 304 is adjacent, longitudinally, to the third region 303. The fourth region 304 mirrors the first region 301. In the fourth region 304, the coupler shoulder 120 splits and tapers outward, away the longitudinal axis 128, until the first portion of the coupler shoulder 120 is separated from the second portion of the coupler shoulder 120 by the second gap 116. Outside edges 308 of the coupler shoulder 120 and the ridges 124 remain constant. In the fourth region 304, the ridge width 218 remains constant in the longitudinal direction. The ridges 124 are separated by the second gap 116.

FIG. 4 is a top view and cross-sectional views of an embodiment of the directional coupler 100. FIG. 4 comprises a first cross section 401, a second cross section 402, a third cross section 403, and a fourth cross section 404. The first cross section 401 is of the directional coupler 100 at the inputs 104. The second cross section 402 is of the directional coupler 100 in the first region 301, with the first portion 408-1 of the coupler shoulder 120 and the second portion 408-2 of the coupler shoulder 120 tapering inward toward the longitudinal axis 128. The third cross section 403 is of the coupler waist 132. The fourth cross section 404 is of the outputs 108.

The first portion 408-1 has a first width 418-1. The second portion 408-2 has a second width 418-2. A total width of the coupler shoulder 120 at the first cross section 401 is equal to the first width 418-1, plus the width of the first gap 112, plus the second width 418-2. A net width of the coupler shoulder 120 at the first cross section 401 is equal to the first width 418-1 plus the second width 418-2. In the second cross section 402, though the total width of the coupler shoulder 120 remains constant compared to the first cross section 401; the net width of the coupler shoulder 120 increases because the first portion 408-1 and the second portion 408-2 are tapering inward, toward the longitudinal axis 128. In the third cross section 403, the total width of the coupler shoulder 120 is equal to the net width of the coupler shoulder 120 because there is no gap between the first portion 408-1 and the second portion 408-2. The total width of the coupler shoulder 120 in the third cross section 403 is more narrow than the total cross section of the coupler shoulder 120 in the second cross section 402 because in the second region 302, outside edges 308 tapered inward. Some number designators are left off some features as to not unduly clutter the figures. A person skilled in the art will recognize similar features even though there are not number designators.

Figure 5:
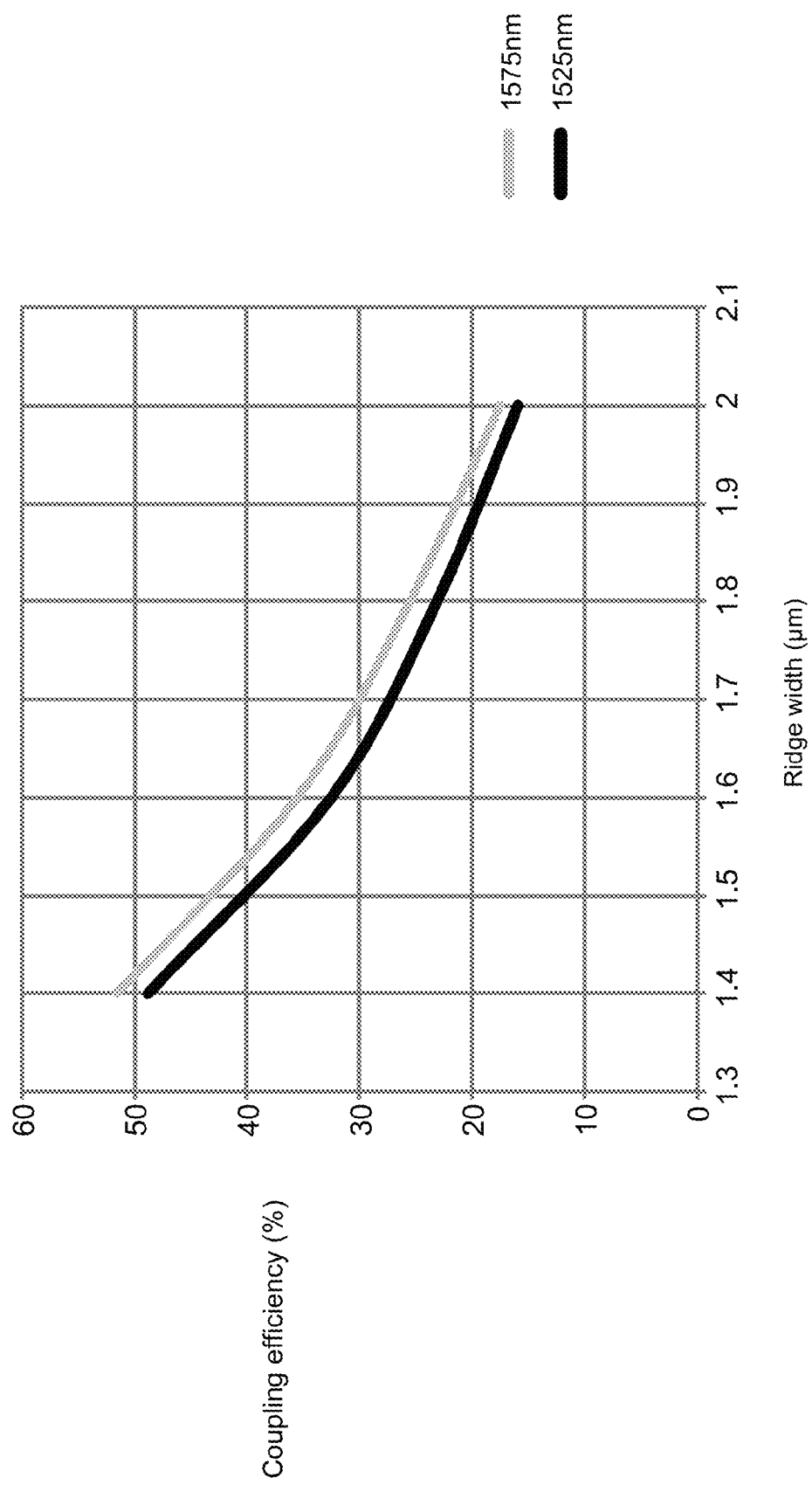
FIG. 5 depicts a graph of coupling efficiency compared to coupling width of an embodiment of the directional coupler.

FIG. 5 is a graph of simulated coupling efficiency compared to the ridge width 218 at the coupler waist 132. Coupling efficiency is an amount of power that enters the first input 104-1 and exits the second output 108-2; or the amount of power that enters the second input 104-2 and exits the first output 108-1. As the ridge width 218 at the coupler waist 132 narrows, coupling efficiency increases. Thus the directional coupler 100 can be designed for a given coupling efficiency by modifying the ridge width 218 at the coupler waist 132.

FIG. 2 is an example of an embodiment of the directional coupler 100 with a ridge width 218 of 1.5 µm at the coupler waist 132. According to the plot in FIG. 4, the directional coupler 100 has bout about 40% coupling efficiency from the first input 104-1 to the second output 108-2 for light at a wavelength of 1525 nm. For a ridge width 218 of 1.9 µm, the directional coupler 100 would have a coupling efficiency a little lower than 20% for light having a wavelength of 1525 nm. Light having a wavelength of 1575 nm has a few more percentage coupling efficiency than light at 1525 nm for a given ridge width 218 at the coupler waist 132.

Figure 6:
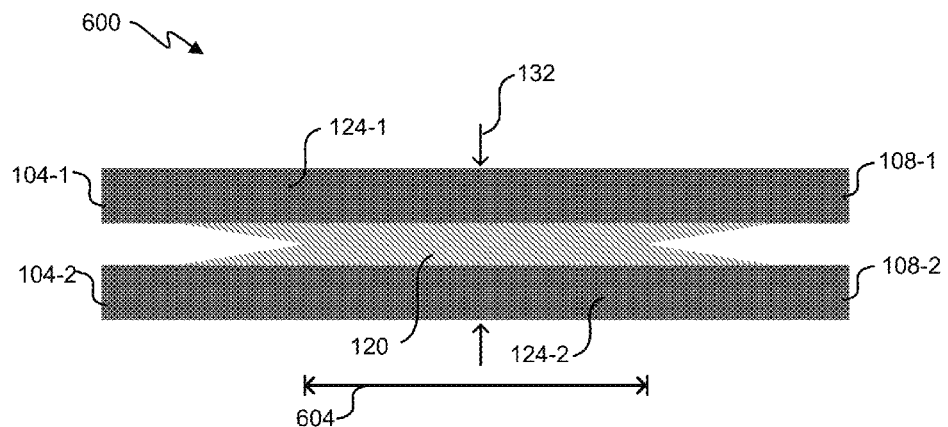
FIG. 6 depicts a top view of an embodiment of a directional coupler, wherein the directional coupler does not have ridge tapers.

FIG. 6 is a top view of a second directional coupler 600, the directional coupler 100 also being referred to as a first directional coupler 100. The second directional coupler 600 is similar to the first directional coupler 100 except that ridges 124 of the second directional coupler 600 do not taper in the second region 302 or the third region 303. The coupler shoulder 120 also does not taper in the second region 302 or the third region 303. Also shown is a coupling length 604. The coupling length 604 begins where the first portion 408-1 and the second portion 408-2 of the coupler shoulder 120 merge and extends, in a longitudinal direction, to where the first portion 408-1 and the second portion 408-2 of the coupler shoulder 120 split. In some embodiments, the second directional coupler 600 is used instead of the first directional coupler 100 to reduce processing complexity and/or to reduce coupling efficiency.

Figure 7:
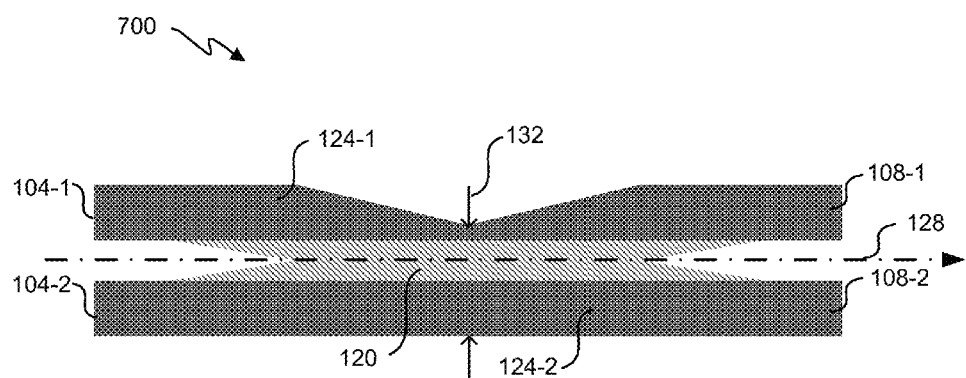
FIG. 7 depicts a top view of an embodiment of a directional coupler, wherein the directional coupler has a first ridge that is tapered and a second taper that is not tapered.

FIG. 7 is a top view of third directional coupler 700. The third directional coupler 700 is asymmetrical about the longitudinal axis 128. The first ridge 124-1 of the third directional coupler 700 tapers (as well as portions of the coupler shoulder 120 under the first ridge), similarly to the first ridge 124-1 of the first directional coupler 100. The second ridge 124-2 of the third directional coupler 700 does not taper, similarly to the second ridge 124-2 of the second directional coupler 600. In some embodiments, having asymmetrical ridges 124 is to have asymmetrical coupling efficiencies. In some embodiments, the second directional coupler 600, the third directional coupler 700, and/or variations on the second directional coupler 600 and/or the third directional coupler 700, are used in place of the first directional coupler 100, based on design constraints of a system (e.g., desired coupling efficiency).

Figure 8:
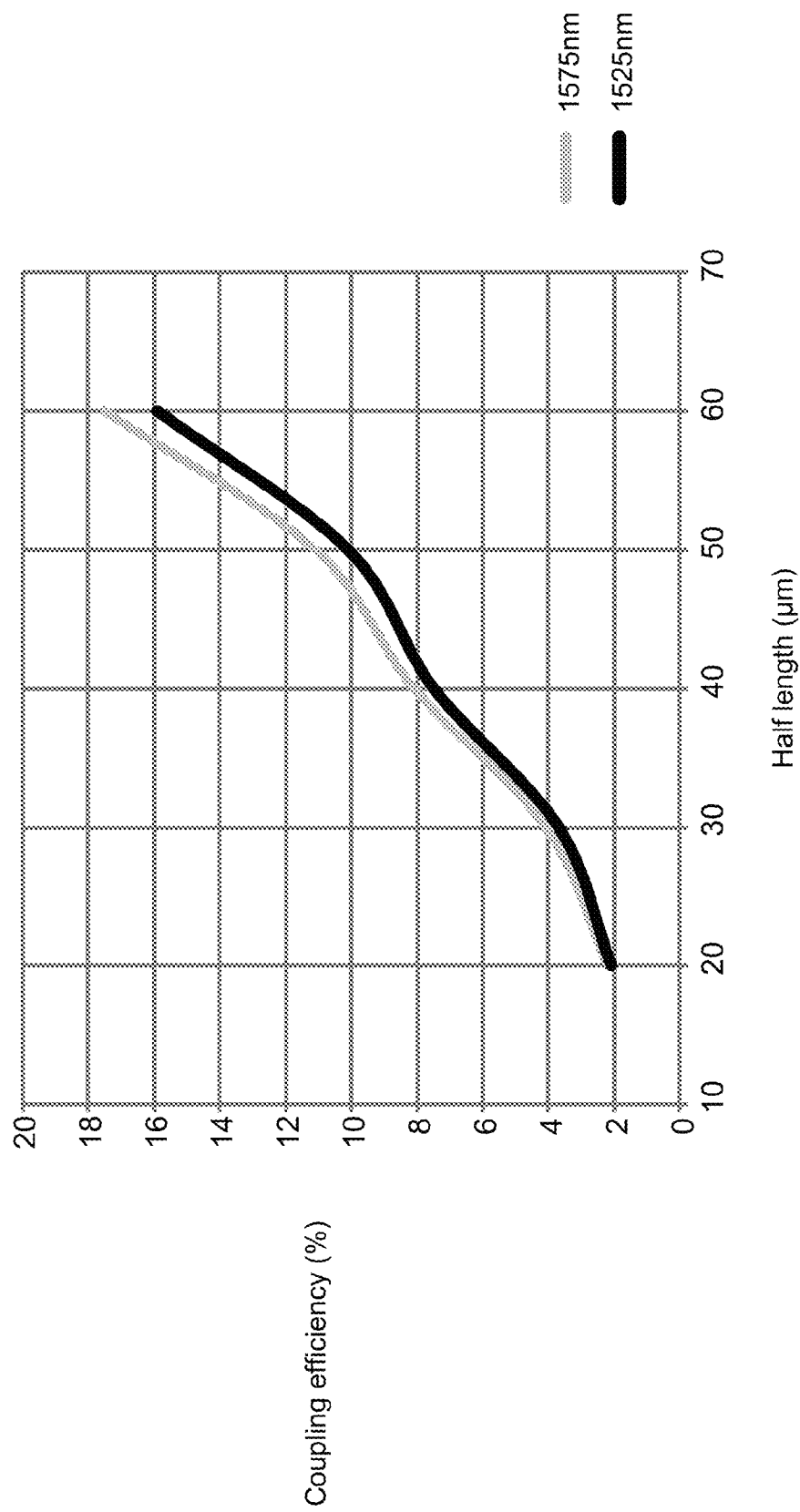
FIG. 8 depicts a graph of coupling efficiency compared to coupling length for an embodiment of the directional coupler.

FIG. 8 is graph of simulated coupling efficiency compared to a half-length of the coupling length 604 for both 1525 nm and 1575 nm light. For example, if the coupling length 604 of the second directional coupler 600 is 40 μm, the coupling efficiency for 1525 nm light is about 2% (½ length of 40 μm is 20 μm; and the graph shows about 2% coupling efficiency at 20 μm). The longer the coupling length 604, the greater the coupling efficiency. In some embodiments, tapering the ridges 124 and having a coupler waist 132 that is smaller is preferred to increase coupling efficiency and/or to reduce a footprint size of the directional coupler 100 on a chip. In some embodiments, the coupling length 604 is less than 120, 90, 80, and/or 60 μm.

Figure 9:
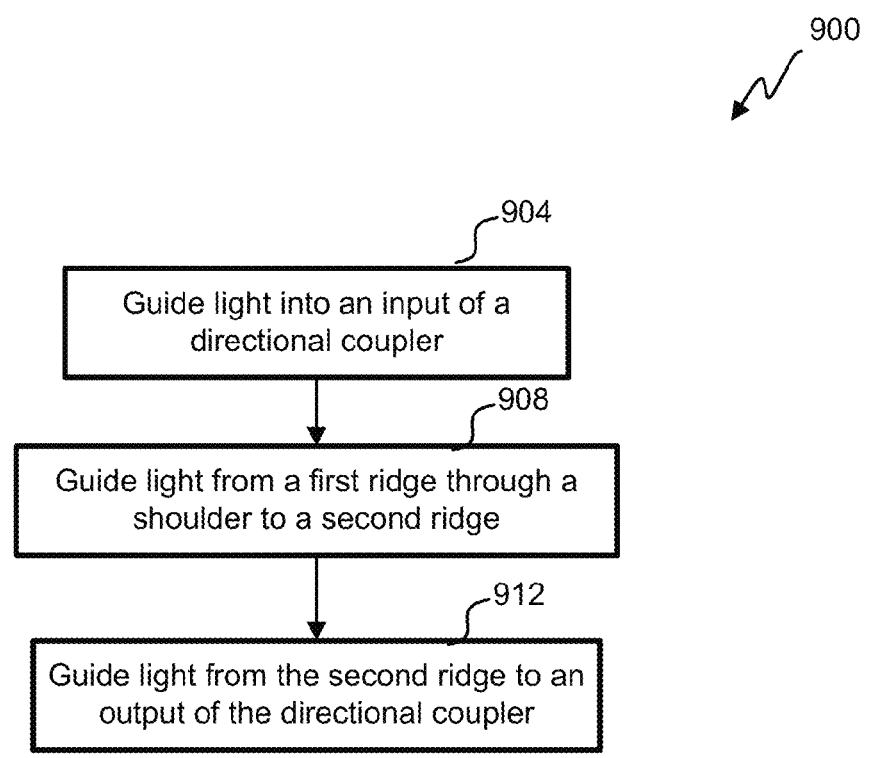
FIG. 9 depicts a flowchart of a process for coupling thick silicon waveguides.

FIG. 9 depicts a flowchart of a process 900 for coupling thick silicon waveguides. The process 900 begins in step 904 where light is guided into the first input 104-1 of the directional coupler 100. In step 908, the light is then guided from the first input 104-1, through the first ridge 124-1, and from the first ridge 124-1 to the second ridge 124-2 through the coupler shoulder 120. In step 912, the light is then guided from the second ridge 124-2 to the second output 108-2.

In some embodiments, a purpose of the directional coupler 100 is to couple a first TE mode from the first input 104-1 to the second output 108-2. In some embodiments, a purpose of the directional coupler 100 is to couple the first TE mode from the first input 104-1 to the second output 108-2 in a relatively short distance (e.g., less than 150, 120, 90, 80, and/or 60 μm). In some embodiments, tapering the coupler shoulder 120 enables adiabatic expansion and/or compression of confined electrometric radiation in the directional coupler 100, thus facilitating coupling the first TE mode (and/or first TM mode) from the first input 104-1 to the second output 108-2. Further, embodiments of this invention are not limited to silicon waveguides, or even semiconductor waveguides. In some embodiments, dielectric directional couplers, and/or metallic directional couplers, are used. For example, polymer waveguides and/or waveguides using aluminum oxide, tantalum oxide, titanium oxide, or other dielectric materials could be used. In some embodiments, ridge tapers are not confined to the second region 302 and the third region 303. For example, a ridge taper can start in the first region 301; a ridge taper can be made to continue from the third region 303 into the fourth region 304; and/or a ridge taper can start in the fourth region 304.

Additionally, there are many possible variations to the embodiments shown. For example, FIGS. 5 and 8 were simulations for a thick silicon, high-contrast waveguides on a substrate 200 (e.g., SiO2 or silicon-on-insulator wafer) with the coupler shoulder 120 and the ridges 124 covered with a cladding (e.g., SiO2). In other variations, the directional coupler 100 is exposed to air or cladded with an epoxy and/or a photoresist. Additionally, in some embodiments, the ridge width 218 ranges from 0.4 to 3.5 μm. In some embodiments, the inputs 104 have a geometry to match a corresponding waveguide (e.g., a ridge waveguide instead of a rectangular waveguide).

Further, even though FIGS. 5 & 8 show plots of simulation results for a given range, those plots can be extrapolated beyond the plotted ranges. Another example variation for coupling, beyond FIGS. 5 and 8, is increasing or decreasing the first gap 112 and/or the second gap 116 between the ridges 124. In some embodiments, the first gap 112 is equal to the second gap 116. Decreasing the first gap 112 and/or the second gap 116 will result in increased coupling; increasing the first gap 112 and/or the second gap 116 will result in decreased coupling. In some embodiments, the first gap 112 and/or the second gap 116 have a width from 0.3 to 3.5 μm. For example, the first gap 112 has a width from 0.3 to 3.5 μm, or from 0.5 to 1.5 μm (e.g., 0.3, 0.5, 0.75, 1.0, 1.25, 1.5, 1.75, 2.0, 2.5, 3.0, or 3.5 μm). In some embodiments, a gap (e.g., >0.75 μm) is used to provide for more favorable fabrication tolerance than tolerances required to make a gap that is less than 0.5 μm. For example, a fabrication tolerance for a 100 nm gap requires special control measures (e.g., temperature control, tight lithographic tolerances, smooth and vertical etching, proper deposition of SiO2/cladding to avoid air gaps and voids, and/or tight process control to avoid stress/strain during SiO2 cladding deposition). A larger gap (e.g., >0.75 μm) facilitates easier manufacturing of the directional coupler 100. Dimensions of the directional coupler 100 can also vary as a function of wavelength.

Further variations to the directional coupler 100 include variations to tapers. For example, instead of a linear taper, a quadratic, log, and/or adiabatic curved tapers can be used. Additionally, the first ridge 124-1 can have different tapers than the second ridge 124-2. For example, the first ridge 124-1 may have a decreasing and increasing taper as shown in FIG. 1. But the second ridge 124-2 has only a decreasing taper in the second region 302 and then the width of the second ridge 124-2 remains constant in the third region 303 and the fourth region 304. In another example, the second ridge 124-2 has a quadratic decreasing taper in the second region 302 and a linear increasing taper in the third region 303. Additionally, the first region 301, the second region 302, the third region 303, and/or the fourth region 304 do not need to be contiguous in their concatenation. For example, there could be a fifth region between the second region 302 and the third region 303.

Figure 10:
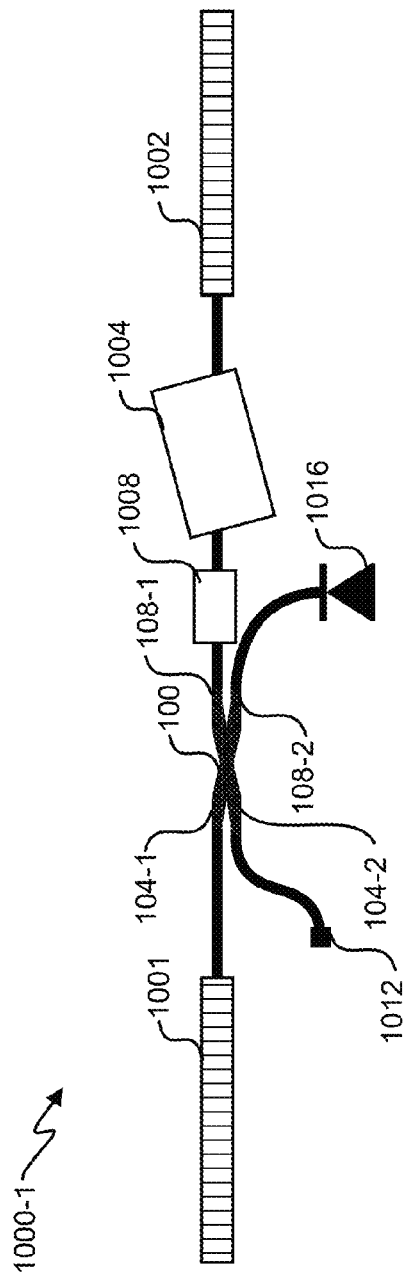
FIG. 10 depicts a simplified diagram of an embodiment of a tunable laser with a directional coupler.

FIG. 10 depicts a simplified diagram of an embodiment of a first laser system 1000-1 having a directional coupler 100. The first laser system 1000-1 comprises a first mirror 1001, a second mirror 1002, a gain medium 1004, and the directional coupler 100. The first laser system 1000-1 further comprises a phase adjuster 1008 and a laser output 1012. In some embodiments, the first laser system 1000-1 comprises a detector 1016.

The first mirror 1001 is optically coupled with the first input 104-1 via a semiconductor waveguide (e.g., have a crystalline silicon core). The laser output 1012 is optically coupled with the second input 104-2 via a waveguide. The detector 1016 is optically coupled with the second output 108-2 via a waveguide. The second mirror 1002 is optically coupled with the gain medium 1004 via a waveguide (e.g., waveguide having a crystalline and/or silicon core). The gain medium 1004 is optically coupled with the phase adjuster 1008 via a waveguide. The phase adjuster 1008 is optically coupled with the first output 108-1 via a waveguide.

The first mirror 1001 and the second mirror 1002 are binary super gratings (BSGs). Examples of BSGs, the gain medium 1004, and phase adjuster 1008 are provided in commonly owned U.S. patent application Ser. No. 13/605, 633, filed on Sep. 6, 2012, which is incorporated by reference for all purposes. A BSG has a super period that defines a reflectance spectrum. A reflectance spectrum has two or more reflectance peaks, referred to as super modes. In some embodiments a reflectance spectrum has between 3 and 12 super modes (e.g., 5, 7, 8, or 11). Cascading multiple super periods increases reflectance of the super modes of the BSG. In some embodiments, the first mirror 1001 and the second mirror 1002 have a similar number of super periods, and/or the first mirror 1001 and the second mirror 1002 both have one or more super modes having reflectance equal to or greater than 80%, 85%, 90%, 95%, 97%, 98%, 99%, 99.5%, 99.9% or 100%. The first mirror 1001 and the second mirror 1002 form a resonator for the first laser system 1000-1. In some embodiments, super mode reflectance is equal to or less than 100% for greater control when tuning to different frequencies. In an optical path between the first mirror 1001 and the second mirror 1002, is the gain medium 1004, the phase adjuster 1008, and the directional coupler 100.

Some systems creates a laser resonator with two mirrors. Generally, one of the two mirrors has a high reflectance (e.g., near 100%), and the other mirror has less reflectance to be used as an output coupler. In the first laser system 1000-1, the first mirror 1001 has a reflectance similar to the reflectance of the second mirror 1002. Output coupling of the first laser system 1000-1 is determined by the coupling efficiency of the directional coupler 100 (and choosing inputs and outputs of the directional coupler 100) and not by a mirror being used as an output coupler. A system using BSGs will sometimes use one BSG (referred to as a "long BSG") that has one or more super periods (often several) than another BSG (referred to as a "short BSG"). more super periods one or more super periods. Such a system is sometimes referred to as a "long-short BSG system." In the long-short BSG system, the short BSG is used as an output coupler for the long-short BSG system because the short BSG has less reflectance than the long BSG.

In some embodiments, the first mirror 1001 and the second mirror 1002 are heated, thus shifting the reflectance spectrums of the BSGs. The reflectance spectrum of the first mirror 1001 is different from the reflectance spectrum of the second mirror 1002. For example, spacing between reflectance peaks ("super modes") of the first mirror 1001 is different than spacing between super modes of the second mirror 1002. The first mirror 1001 and the second mirror 1002 are tuned (e.g., by heating) so that one super mode of the first mirror 1001 overlaps with one super mode of the second mirror 1002. By having higher BSG reflectance (e.g., cascading more super periods), spectral width of a super mode is narrowed, giving more control for tuning the first laser system 1000-1 than if either the first mirror 1001 or the second mirror 1002 was used as an output coupler and had fewer super periods.

The detector 1016 can be used for various purposes. In some embodiments, the detector 1016 is used for monitoring and control of laser power and frequency of the first laser system 1000-1 by using a photodiode (PD) (e.g., a tap-PD). In some embodiments, the gain medium 1004 comprises a III-V compound material and the first mirror 1001, the second mirror 1002, the directional coupler 100, are made of silicon. In some embodiments, the first mirror 1001, the directional coupler 100, the phase adjuster 1008, the second mirror 1002, the detector 1016, and/or connecting waveguides are formed together, monolithically, on a semiconductor chip (e.g., on an SOI wafer). In some embodiments, the directional coupler 100 is replaced with the third directional coupler 700 to reduce potential reflections from the detector 1016 entering the laser resonator.

Figure 11:
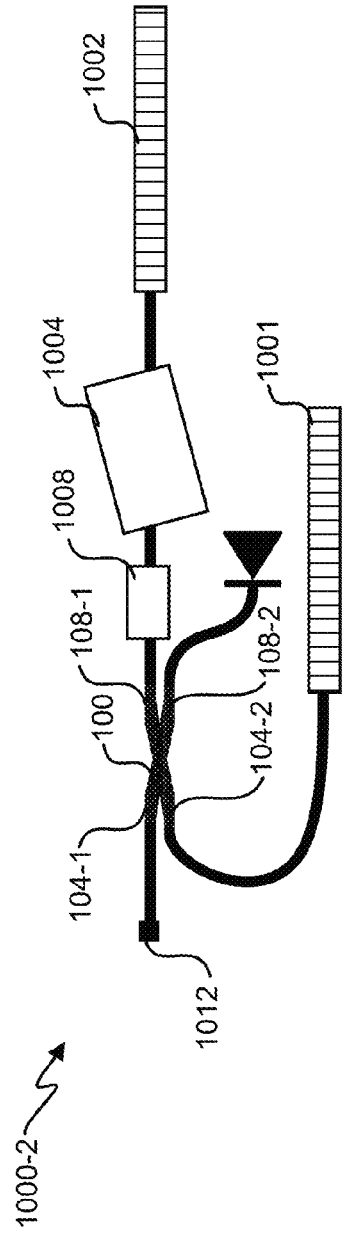
FIG. 11 depicts a simplified diagram of another embodiment of a tunable laser with a directional coupler.

Referring next to FIG. 11, a simplified diagram of a second laser system 1000-2 is shown. The second laser system 1000-2 is similar to the first laser system 1000-1 except the first mirror 1001 is optically coupled with the second input 104-2 and the laser output 1012 is optically coupled with the first input 104-1. The first mirror 1001 and the second mirror 1002 of the second laser system 1000-2 have similar reflectivity for a given wavelength when tuned. An equivalent reflectivity ($R_{eq}$) is given by: $R_{eq}=\kappa^2$, where $\kappa$ is the coupling efficiency of the directional coupler 100. Sometimes, $\kappa<50\%$ is considered weak coupling and $\kappa \geq 50\%$ is considered strong coupler. As an example, $\kappa=30\%$ (weak coupling). Output coupling of the second laser system 1000-2 (transmission) is given by: T (transmission)$=1-\kappa=70\%$. And $R_{eq}=\kappa^2=9\%$. Thus 70% of power from the first output 108-1 (e.g., from a direction of the gain medium 1004) is transmitted to first input 104-1 and to the laser output 1012; while 30% is transmitted to the second input 104-2 and to the first mirror 1001. The first mirror 1001 reflects the 30% transmitted to the first mirror 1001 back to the second input 104-2. Thirty percent of the power reflected back to the second input 104-2 is coupled into the first output 108-1 ($30\% \times 30\%=9\%$ of original power that was transmitted to the second output 108-1); and seventy percent of the power reflected back to the second input 104-2 is coupled to the second output 108-2 and transmitted to the detector 1016 ($30\% \times 70\%=21\%$ of original power that was transmitted to the first output 108-1).

Referring back to FIG. 10, if $\kappa=70\%$ (strong coupling) for the directional coupler 100 of the first laser system 1000-1, then the first laser system 1000-1 would have the same effective reflectivity as the second laser system 1000-2 having a directional coupler 100 with $\kappa=30\%$.

Figure 12:
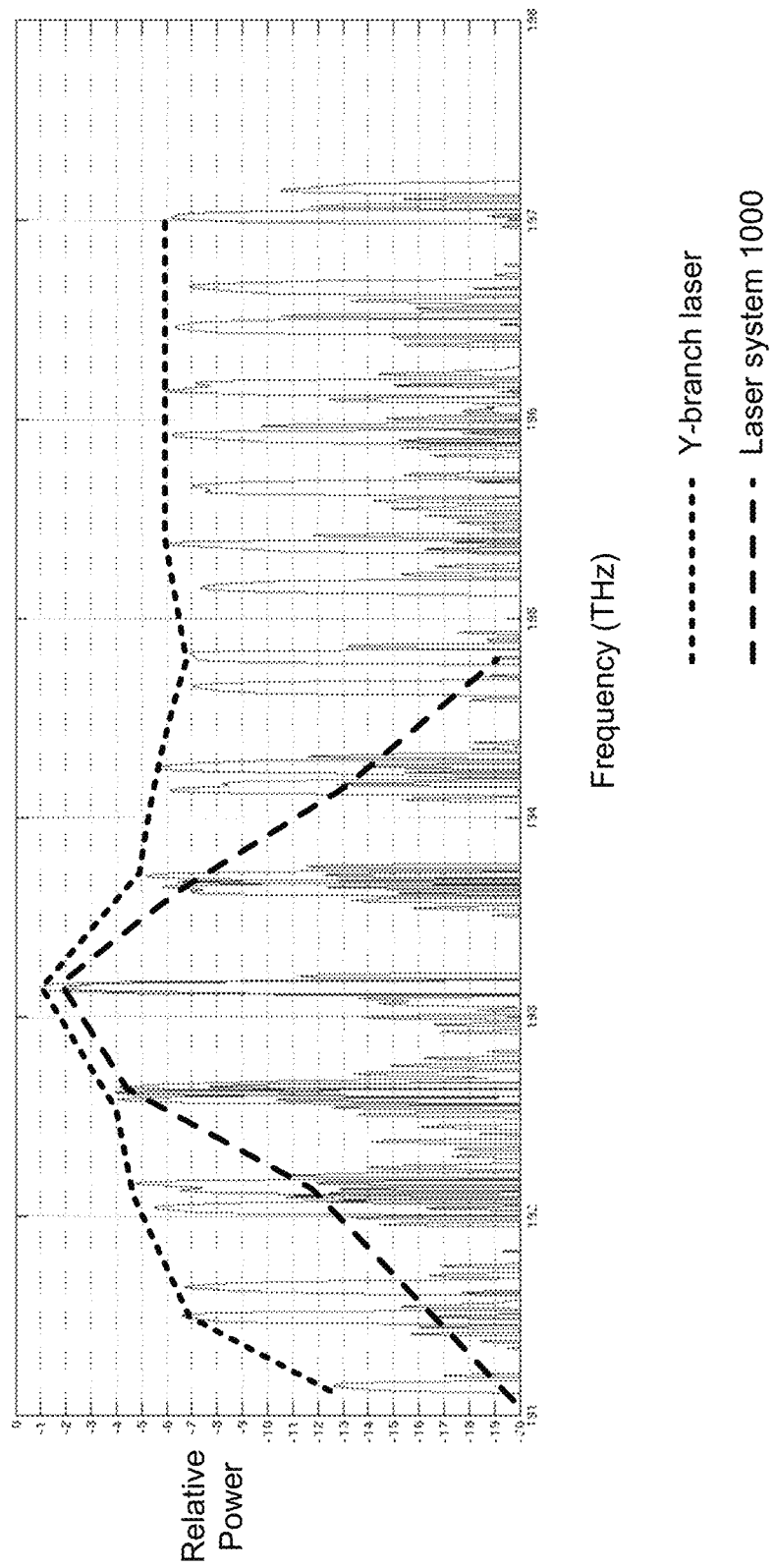
FIG. 12 is a chart comparing normalized combined responses of a Y-branch laser and an embodiment of a laser with a directional coupler.

FIG. 12 depicts a chart comparing normalized combined responses of a Y-branch laser and the laser system 1000 with the directional coupler 100. The Y-branch laser is similar to a Y-branch laser in the commonly owned '633 application. An x axis is frequency (THz) and a y axis is relative power (dB). FIG. 12 shows that the laser system 1000 with the directional coupler 100 suppresses adjacent super modes more than the Y-branch laser. In some embodiments, having suppressed adjacent super modes allows the laser system 1000 to be more easily tuned.

Figure 13:
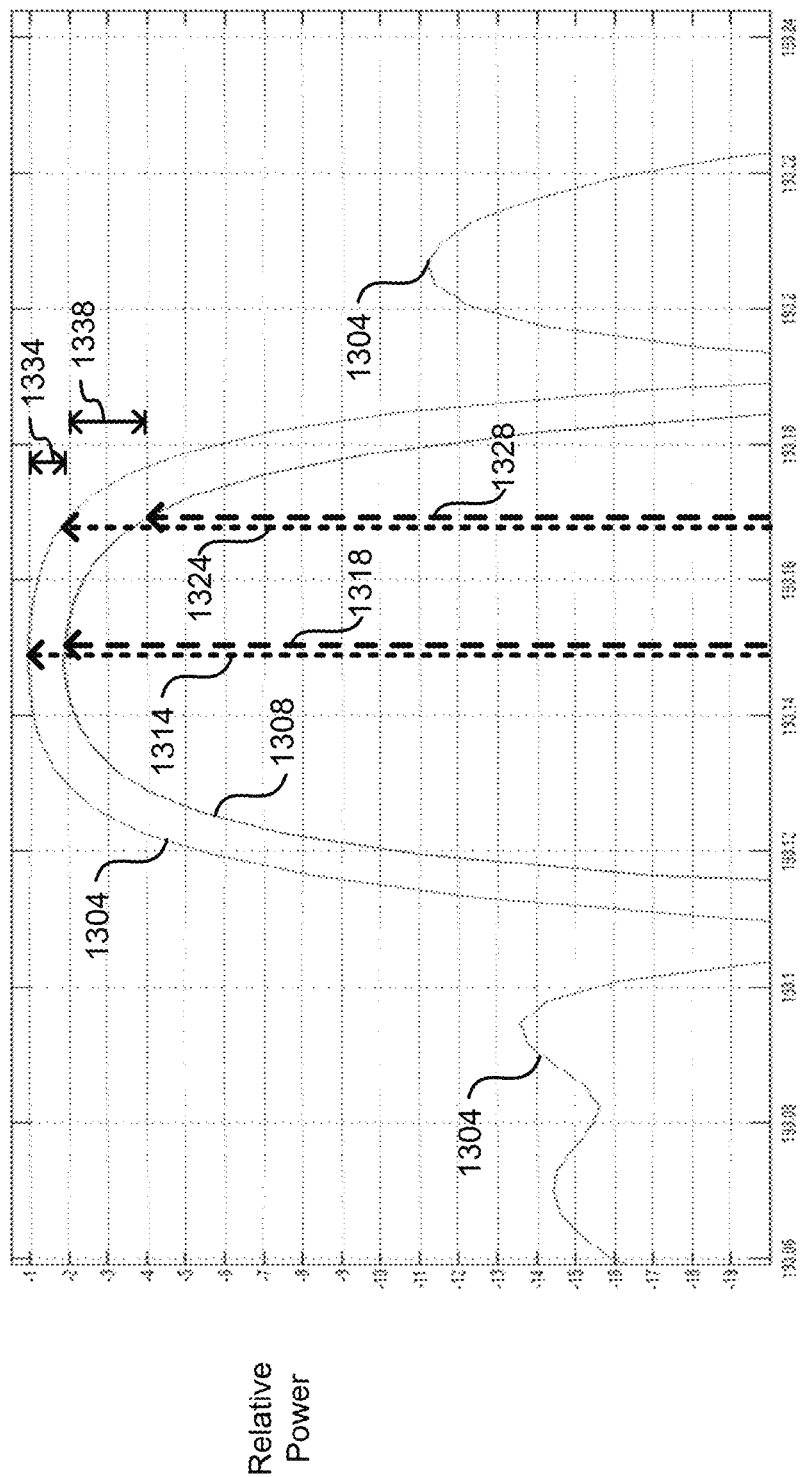
FIG. 13 is a zoomed up portion of the chart in FIG. 12.

FIG. 13 depicts a zoomed-in portion of the normalized combined responses in FIG. 12. A combined response 1304, with a combined-response peak, for the Y-branch laser is shown. The combined-response peak of the Y-branch laser has a 1 dB bandwidth of about 40 GHz. A combined response 1308, with a combined-response peak, for the laser system 1000 is shown. The laser system 1000 with the directional coupler 100 has a combined-response peak having a 1 dB bandwidth of about 27 GHz. A first lasing mode 1314 and a second lasing mode 1318 are shown. The first lasing 1314 mode is for the Y-branch laser. The second lasing mode 1318 is for the laser system 1000. A first side mode 1324 (e.g., cavity longitudinal mode) and a second side mode 1328 (e.g., cavity longitudinal mode) are shown. The first side mode 1324 is for the Y-branch laser. The second side mode 1328 is for the laser system 1000. A first difference 1334 is shown. The first difference 1334 is a power difference between the first lasing mode 1314 and the first side mode 1324. A second difference 1338 is shown. The second difference 1338 is a power difference between the second lasing mode 1318 and the second side mode 1328. The second difference 1338 (~2 dB) is about twice the first difference 1334 (~1 dB). Thus the laser system 1000 will have better side-mode suppression than the Y-branch laser. When lasing, this effect will be exacerbated providing a side-mode suppression radio (SMSR) ~50 dB for the laser system 1000 with the directional coupler 100.

The Y-branch laser is known to be better than the long-short BSG system for suppressing adjacent super modes, but can leave super modes that are further away (from a desired lasing frequency) with relatively high reflectivity. If the Y-branch laser has some asymmetry due to a centering offset (e.g., one BSG is not tuned with sufficient accuracy), the super modes that are further away can lase. On the other hand, long-short BSG systems are better than the Y-branch laser as suppressing super modes that are further away. One reason that long-short BSG systems are worse at adjacent super-mode suppression is that the short BSG of the long-short BSG system has wider, more rounded reflection peaks, which can overlap with one or more reflection peaks of the long BSG that are meant to be misaligned. In some embodiments, the laser system 1000 with the directional coupler 100 improves the best of both the Y-branch laser and the long-short BSG system: the laser system 1000 with the directional coupler has higher suppression of adjacent super modes and super modes that are further away. The laser system 1000 also has higher suppression of adjacent cavity (longitudinal) modes than both the Y-branch laser and the long-short BSG system.

Figure 14:
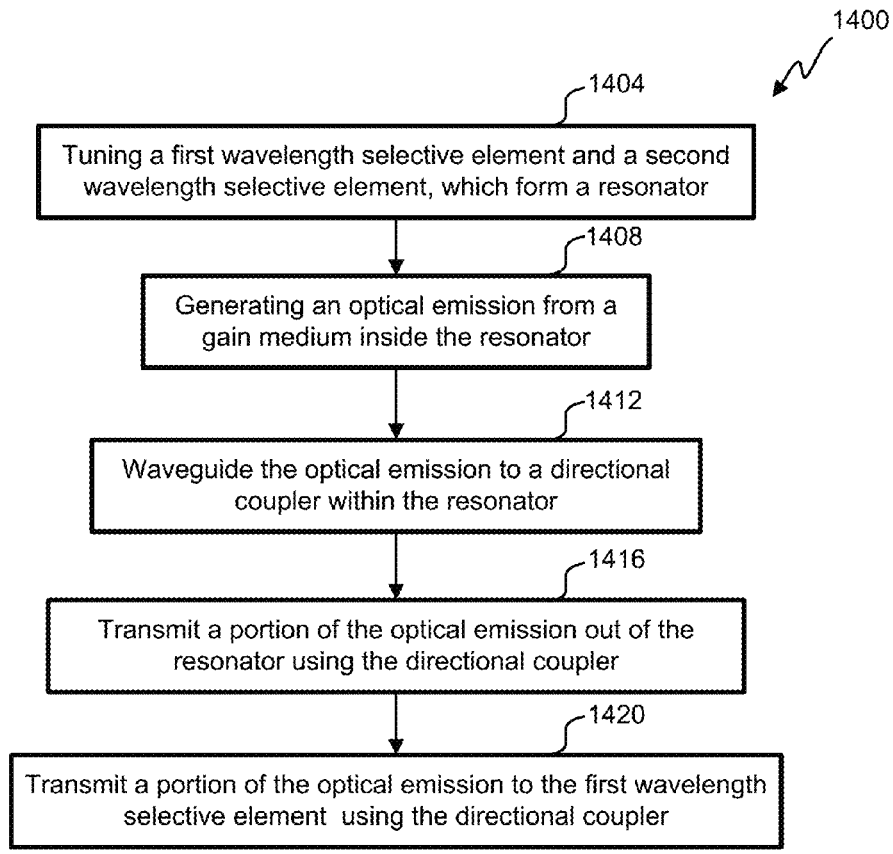
FIG. 14 depicts a flowchart of a process for using a laser with a directional coupler.

FIG. 14 depicts a flowchart of an embodiment of a process 1400 for using the laser system 1000 with the directional coupler 100. The process begins in step 1404 where a first wavelength selective element (e.g., the first mirror 1001 using a first BSG) and a second wavelength selective element (e.g., the second mirror 1002 using a second BSG) are tuned. The first wavelength selective element and the second wavelength selective element form a laser resonator. In some embodiments, the first wavelength selective element and the second wavelength selective element are tuned using heat. In some embodiments, the first wavelength selective element and the second wavelength selective element are tuned so that super modes of the first BSG and the second BSG have overlapping super modes at a predetermined frequency (e.g., tuning the laser system 1000 using the Vernier effect).

In step 1408, light (optical emission) is generated by the gain medium 1004 in the resonator (and/or reflected from the second mirror 1002). In some embodiments, light is generated by applying current to a III-V compound (e.g., InP or GaAs) semiconductor structure having a quantum well region. Light in the resonator is guided to the directional coupler 100 (e.g., by a waveguide), step 1412. The directional coupler 100 transmits a portion of the light out of the resonator, step 1416, and transmits a portion of the light to the first wavelength selective element (e.g., the first mirror 1001), step 1420.

Embodiments of the present invention provide a capability to independently adjust output coupler transmission (and effective coupler reflectivity) of a laser from spectral properties of a mirror (e.g., first mirror 1001). Thus some embodiments use long, high reflectivity BSGs, which have the advantages of: (1) narrower peaks, which can allow for greater selectivity using the Vernier effect and suppression of adjacent longitudinal modes; and (2) peaks of substantially uniform strength; this is in contrast to lasers without a directional coupler 100 that use short BSGs to achieve higher output coupler transmission for better slope efficiency. Also, some embodiments enable choosing variable output coupling by designing an appropriate splitting ratio (e.g., coupling efficiency) of the directional coupler 100; whereas without the directional coupler 100, an ability to select output coupling of the laser (reflectivity and transmission) is coarse because a length of a BSG is not continuously selectable, but typically selected as an integral number of super periods.

Further, in some embodiments, it is desirable to have peak reflectance of BSG super modes less than or equal to 100%. BSG length is long enough to allow for high reflection in the center of the super modes, but not too long, in order to prevent a flat top of reflectivity at a given frequency. In some embodiments, curvature of a super mode is helpful to improve suppression of adjacent cavity modes (longitudinal modes) with respect to a lasing mode present in a center of an aligned pair of BSGs. In some embodiments, since: (1) it is desirable to have peak reflectance of BSG super modes less than or equal to 100%; and (2) BSG reflectance is increased by adding discrete number of super modes, the first mirror 1001 (comprising a first BSG) and the second mirror 1002 (comprising a second BSG) may have similar, but not equal reflectance peaks. For example, for a first given frequency, a reflectance peak of the first BSG may be 82% while the second BSG reflectance peak may be 91%. In another example, for a given frequency, the first BSG may have a reflectance peak at 99% and the second BSG have a reflectance peak at 97%.

Figure 15:
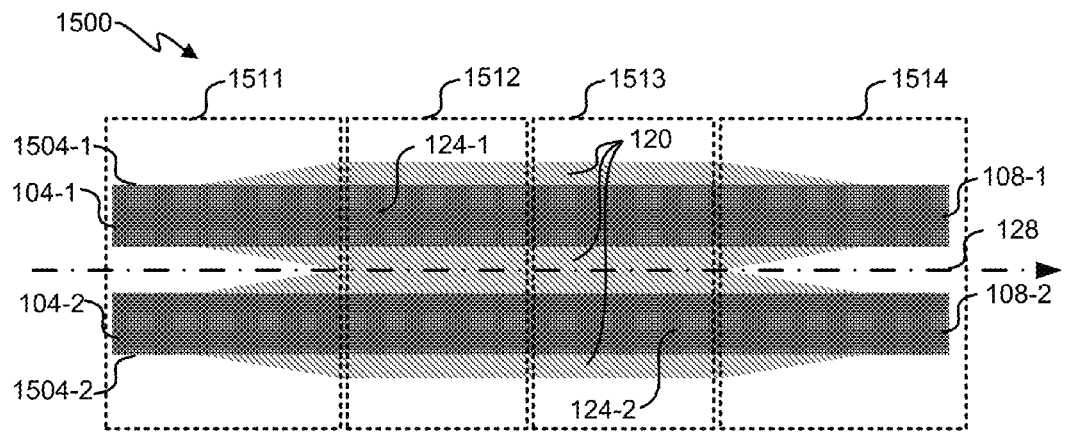
FIG. 15 depicts a top view of an embodiment of a directional coupler having a shoulder that tapers wider than ridges.

Referring next to FIG. 15, a top view of a fourth directional coupler 1500 is shown. In some embodiments, the fourth directional coupler 1500, and/or variations on the fourth directional coupler 1500, are used instead of the first directional coupler 100. The fourth directional coupler 1500 is similar to the third directional coupler 600, but with a wider shoulder 120. The first ridge 124-1 has a first outside edge 1504-1, which is opposite an inside edge of the first ridge 1240-1 that is closer to the longitudinal axis 128 than the first outside edge 1504-1. The second ridge 124-2 has a second outside edge 1504-2, which is opposite an inside edge of the second ridge 1240-2 that is closer to the longitudinal axis 128 than the second outside edge 1504-2.

The fourth directional coupler 1500 has four regions: a first region 1511, a second region 1512, a third region 1513, and a fourth region 1514. In the first region 1511, the shoulder 120 tapers inward in a longitudinal direction, toward the longitudinal axis 128, as described in connection to FIG. 3. Additionally, the shoulder 120 tapers outward, away from the first outside edge 1504-1 and the second outside edge 1504-2. In some embodiments, the shoulder 120 tapers as much outward as the shoulder 120 tapers inward. In the second region 1512 and the third region 1513, the shoulder has a constant width (though in some embodiments, the shoulder could continue to taper and/or start to taper). In the fourth region 1514, the shoulder 120 tapers toward the outside edges 1504, in addition to splitting as described in FIG. 3.

In some embodiments, the shoulder 120 tapers outside the outside edges 1504 to reduce the coupling efficiency (i.e., reduce κ), and/or control to more accuracy the coupling efficiency. In some embodiments, the shoulder tapers 120 outside the outside edges 1504 to reduce polarization rotation. Asymmetry about a ridge 124 can cause polarization rotation. For some applications, polarization rotation is undesirable. For example, in some Dense Wavelength Division Multiplexing (DWDM) systems, polarization must be very clear to separate different polarizations, and, in some DWDM systems, efficiency drops as even a little polarization rotation is introduced.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of exemplary embodiments of the invention has been presented for the purposes of illustration and description. It is not intended to be exhaustive or to limit the invention to the precise form described, and many modifications and variations are possible in light of the teaching above. For example, in some embodiments, the directional coupler is disposed on a silicon substrate with other devices such as a CMOS device, a BiCMOS device, an NMOS device, a PMOS device, a detector, a CCD, diode, heating element, or a passive optical device (e.g., a waveguide, an optical grating, an optical splitter, an optical combiner, a wavelength multiplexer, a wavelength demultiplexer, an optical polarization rotator, an optical tap, a coupler for coupling a smaller waveguide to a larger waveguide, a coupler for coupling a rectangular silicon waveguide to an optical fiber waveguide, or a multimode interferometer).

The embodiments were chosen and described in order to explain the principles of the invention and practical applications to thereby enable others skilled in the art to utilize the invention in various embodiments and with various modifications as are suited to the particular use contemplated.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in the figure. A process may correspond to a method, a function, a procedure, a subroutine, a subprogram, etc.

A recitation of "a", "an", or "the" is intended to mean "one or more" unless specifically indicated to the contrary.

All patents, patent applications, publications, and descriptions mentioned here are incorporated by reference in their entirety for all purposes. None is admitted to be prior art.

What is claimed is:

1. A directional coupler for optically coupling waveguides, the directional coupler comprising:
    a first input;
    a second input;
    a first output;
    a second output;
    a shoulder disposed on a substrate, wherein:
        the shoulder extends from the first input to the first output, from the second input to the second output, from the first input to the second output, and from the second input to the first output; and
        the shoulder comprises a material;
        a first ridge is disposed on the shoulder and extends from the first input to the first output, wherein the first ridge comprises the material; and
    a second ridge is disposed on the shoulder and extends from the second input to the second output, wherein:
        the second ridge comprises the material; and
        the second ridge is separate from the first ridge;
    and wherein the directional coupler further comprises:
    a first region where the shoulder tapers;
    a second region where the first ridge and the second ridge taper;
    a third region where the first ridge and the second ridge taper in an opposite direction than in the second region; and
    a fourth region where the shoulder tapers in an opposite direction than in the first region.

2. The directional coupler for optically coupling waveguides as recited in claim 1, wherein:
    the shoulder tapers in the first region to increase a width of the shoulder; and
    the shoulder extends beyond an outside edge of the first ridge and beyond an outside edge of the second ridge.

3. A directional coupler for optically coupling waveguides, the directional coupler comprising:
    a first input;
    a second input;
    a first output;
    a second output;
    a shoulder disposed on a substrate, wherein:
        the shoulder extends from the first input to the first output, from the second input to the second output, from the first input to the second output, and from the second input to the first output; and
        the shoulder comprises a material;
    a first ridge, disposed on the shoulder and extending from the first input to the first output, wherein the first ridge comprises the material; and
    a second ridge, disposed on the shoulder and extending from the second input to the second output, wherein the second ridge comprises the material and the second ridge is separate from the first ridge;
    wherein the directional coupler further comprises:
        a first region where the shoulder tapers;
        a second region where the first ridge and the second ridge taper;
        a third region where the first ridge and the second ridge taper in an opposite direction than in the second region; and
        a fourth region where the shoulder tapers in an opposite direction than in the first region;
    and wherein:
    a width of the first ridge decreases in the second region in a longitudinal direction from the first input to the first output; and
    a width of the first ridge increases in the third region in the longitudinal direction from the first input to the first output.

4. The directional coupler for optically coupling waveguides as recited in claim 3, wherein:
    the first ridge has an outside edge; and
    the width of the first ridge decreases in the second region by tapering the outside edge; and
    the width of the first ridge increases in the third region by tapering the outside edge.

5. The directional coupler for optically coupling waveguides as recited in claim 1, wherein:
    the substrate comprises silicon dioxide; and
    the material is crystalline silicon.

6. The directional coupler for optically coupling waveguides as recited in claim 1, wherein the material is a dielectric.

7. The directional coupler for optically coupling waveguides as recited in claim 1, wherein:
    the shoulder has a thickness between 0.5 and 1.2 µm; and
    the first ridge and the second ridge each have a height between 0.2 and 0.65 µm.

8. The directional coupler for optically coupling waveguides as recited in claim 1, wherein the directional coupler is symmetric along a longitudinal axis between the first ridge and the second ridge.

9. The directional coupler for optically coupling waveguides as recited in claim 1, wherein:
the first ridge has a minimum width; and
the second ridge has a minimum width.

10. The directional coupler for optically coupling waveguides as recited in claim 9, wherein the minimum width of the first ridge is different from the minimum width of the second ridge.

11. The directional coupler for optically coupling waveguides as recited in claim 1, wherein:
a direction from the first input to the first output, and from the second input to the second output, defines a direction of beam propagation; and
the first, second, third and fourth regions are located in sequence along the direction of beam propagation.

12. The directional coupler for optically coupling waveguides as recited in claim 11, wherein:
each of the first and second ridges defines an inner lateral edge and an outer lateral edge, wherein:
the inner lateral edges of the first and second ridges face one another;
the outer lateral edges of the first and second ridges face away from the directional coupler;
the inner lateral edge of the first ridge forms a straight line along the direction of beam propagation between the first input and the first output;
the inner lateral edge of the second ridge forms a straight line along the direction of beam propagation between the second input and the second output;
the shoulder defines lateral edges;
the lateral edges of the shoulder at the first input, the second input, the first output and the second output are coincident with the lateral edges of the first ridge and the second ridge;
in the first region, the lateral edges of the shoulder taper by deviating from the inner lateral edges of the ridges so as to narrow a gap in the material of the shoulder along the direction of beam propagation, until the gap in the material of the shoulder disappears in the direction of beam propagation; and
in the fourth region, the lateral edges of the shoulder taper by forming a gap in the material of the shoulder at a beginning of the fourth region, wherein the gap widens in the fourth region along the direction of beam propagation until the lateral edges of the shoulder are coincident with the lateral edges of the first ridge and the second ridge.

13. The directional coupler for optically coupling waveguides as recited in claim 12, wherein in the second region, the first ridge tapers along the direction of beam propagation such that the outer lateral edge of the first ridge becomes closer to the inner lateral edge of the first ridge, such that the first and second ridges form a coupler waist at an end of the second region.

14. The directional coupler for optically coupling waveguides as recited in claim 13, wherein in the second region, the second ridge also tapers along the direction of beam propagation, such that the outer lateral edge of the second ridge becomes closer to the inner lateral edge of the second ridge.

* * * * *